(12) United States Patent
Matsuki

(10) Patent No.: US 6,998,740 B2
(45) Date of Patent: Feb. 14, 2006

(54) DRIVE CIRCUIT DEVICE AND MOTOR HAVING THE SAME

(75) Inventor: Tatsuhiro Matsuki, Obu (JP)

(73) Assignee: Asmo Co., Ltd., Shizuoka-pref. (JP)

( * ) Notice: Subject to any disclaimer, the term of this patent is extended or adjusted under 35 U.S.C. 154(b) by 0 days.

(21) Appl. No.: 10/998,573

(22) Filed: Nov. 30, 2004

(65) Prior Publication Data

US 2005/0121986 A1    Jun. 9, 2005

(30) Foreign Application Priority Data

Dec. 5, 2003    (JP) .............................. 2003-407934

(51) Int. Cl.
*H02K 1/32*    (2006.01)
*H02K 11/00*    (2006.01)
(52) U.S. Cl. ..................................... 310/64; 310/68 D
(58) Field of Classification Search ................. 310/64, 310/68 R, 68 D, DIG. 6
See application file for complete search history.

(56) References Cited

U.S. PATENT DOCUMENTS

| 6,107,708 A | 8/2000 | Yamaguchi et al. |
| 6,525,438 B1 * | 2/2003 | Asao ........................ 310/68 D |
| 6,617,719 B2 * | 9/2003 | Sunaga et al. ................ 310/64 |

FOREIGN PATENT DOCUMENTS

JP    A-2001-251833    4/2001

* cited by examiner

*Primary Examiner*—Darren Schuberg
*Assistant Examiner*—Leda Pham
(74) *Attorney, Agent, or Firm*—Posz Law Group, PLC

(57) ABSTRACT

A heat sink member divides a circuit board into a first circuit part and a second circuit part. The first circuit part includes circuit elements, such as a transistor, an electric current sensing resistor and a choke coil, which generate heat upon operation thereof. The second circuit part includes a control circuit, which controls operation of the motor.

10 Claims, 3 Drawing Sheets

DRIVE CIRCUIT DEVICE AND MOTOR HAVING THE SAME

CROSS REFERENCE TO RELATED APPLICATION

This application is based on and incorporates herein by reference Japanese Patent Application No. 2003-407934 filed on Dec. 5, 2003.

BACKGROUND OF THE INVENTION

1. Field of the Invention

The present invention relates to a drive circuit device of a motor and a motor having the same.

2. Description of Related Art

In a drive circuit device, which is provided in a motor to control operation of the motor, a control circuit (IC) and high heat-generating elements (e.g., a drive transistor, a diode, a coil and an electric current sensing resistor) are both provided in a common circuit board. When heat, which is generated by these circuit elements, is conducted to the heat sensitive control circuit, the heat could cause failure of the control circuit. Thus, a control circuit, which has a high rated temperature, needs to be used, and this disadvantageously results in an increase in the manufacturing costs.

Japanese Unexamined Patent Publication No. 2001-251833 discloses a motor, which addresses such a problem. In this motor, the drive circuit device is received in a circuit protective case, which is provided in a lower part of the motor. The drive circuit device includes a filter circuit, a switching circuit and a control circuit. The filter circuit removes surge or the like from the supplied electric power. The switching circuit changes an electric current path to the motor to change a magnetic field generated in the motor. The control circuit controls timing for switching the electric current path of the switching circuit to control rotation of the motor. The filter circuit includes a field-effect capacitor, a choke coil and a wiring bus bar and is installed in an inner case. The switching circuit includes a plurality of switching elements (the drive transistors), which switch the electric current path. The switching elements are urged against the heat sink member arranged above the switching elements. Furthermore, the control circuit includes a control IC and a Hall element. The control IC controls the timing for switching the electric current path of the switching elements. The Hall element senses a rotational position of the motor in cooperation with the sensor magnet. The switching circuit and the control circuit are arranged in the circuit board.

A partition wall, which divides the circuit protective case into two parts, is integrally formed with the circuit protective case and the inner case. The partition wall divides the circuit board into a part, in which the switching circuit is formed, and another part, in which the control circuit is formed. This partition wall controls transmission of the heat, which is generated from the switching elements, to the control circuit.

However, in the motor disclosed in Japanese Unexamined Patent Publication No. 2001-251833, the partition wall is newly provided in the circuit protective case to limit transmission of the heat, which is generated from the switching elements, to the control circuit. Thus, the structure becomes complicated. Furthermore, the provision of the circuit protective case causes an increase in a size of the drive circuit device and also an increase in a size of the motor.

SUMMARY OF THE INVENTION

The present invention addresses the above disadvantages. Thus, it is an objective of the present invention to provide a drive circuit device of a motor, which has a simple structure and can limit transmission of heat generated from constituent elements of the drive circuit device to a control circuit without causing an increase in a size of the drive circuit device. It is another objective of the present invention to provide a motor, which has such a drive circuit device.

To achieve the objectives of the present invention, there is provided a drive circuit device for a motor. The drive circuit device includes a plurality of circuit elements, a heat sink member, a control circuit and a circuit board. The circuit elements are provided to operate the motor and generate heat upon operation thereof. The heat sink member releases the heat, which is generated from one or more of the plurality of circuit elements. The control circuit controls operation of the motor. The circuit board supports the plurality of circuit elements, the heat sink member and the control circuit. The heat sink member divides the circuit board into a first circuit part and a second circuit part. The first circuit part includes at least one of the plurality of circuit elements. The second circuit part includes the control circuit.

To achieve the objectives of the present invention, there is also provided a motor, which includes the above drive circuit device.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

One embodiment, in which the present invention is embodied in a vehicle air conditioning system motor, will be described with reference to the accompanying drawings.

Figure 1:
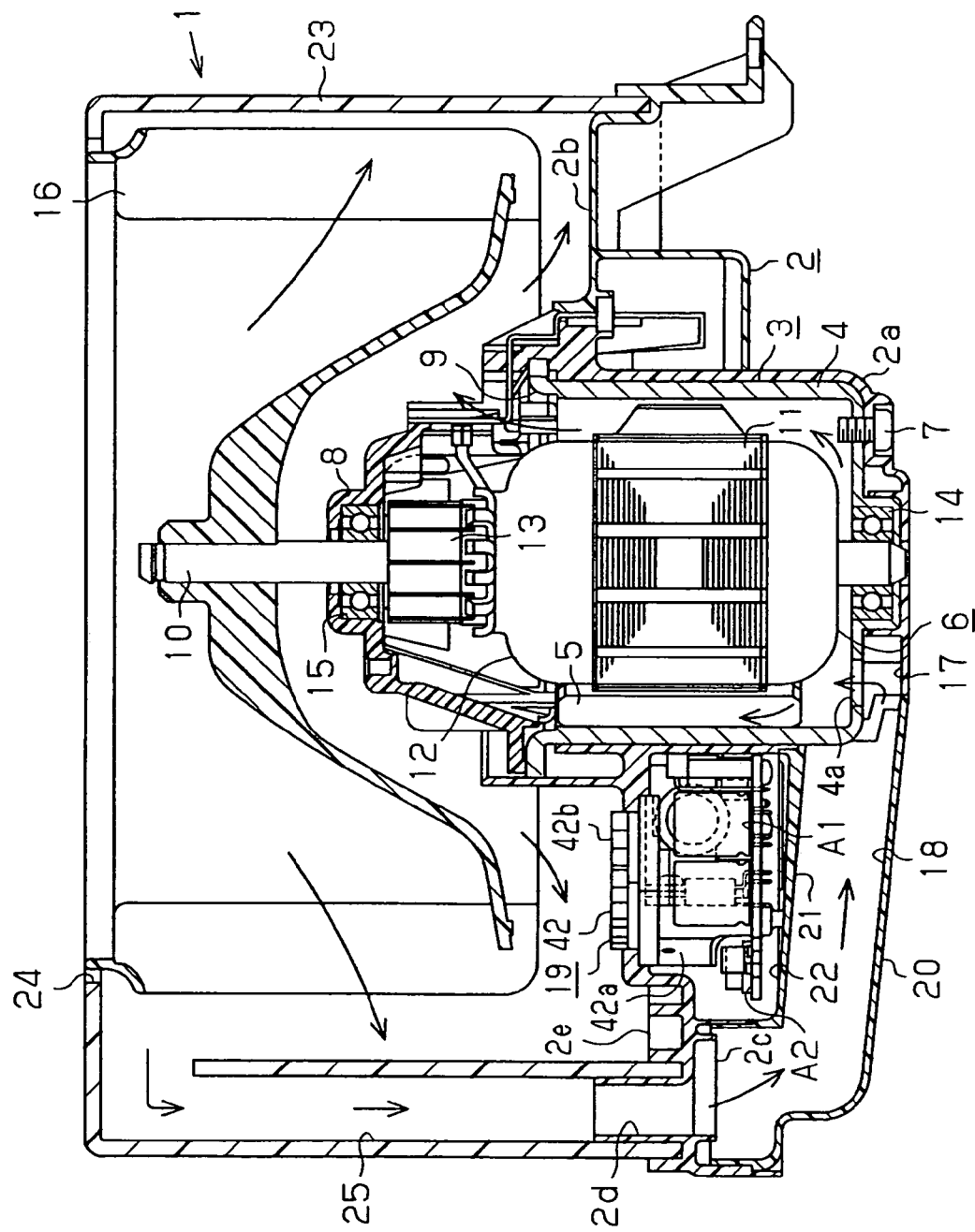
FIG. 1 is a cross sectional view of a vehicle air conditioning system motor according to an embodiment of the present invention.

As shown in FIG. 1, a motor holder 2 of the vehicle air conditioning system motor 1, which serves as a motor, includes a generally cup shaped receiving portion 2a and a flange 2b. The flange 2b is disk shaped and extends along an outer peripheral edge of the receiving portion 2a. A motor main body 3 is received in the receiving portion 2a.

The motor main body 3 is a direct current motor and includes a cup shaped yoke 4, magnets 5 and an armature 6. The magnets 5 are secured to an inner peripheral surface of the yoke 4. The armature 6 is rotatably received radially inward of the magnets 5. The motor main body 3 is secured to the motor holder 2 when a base of the yoke 4 and a base of the receiving portion 2a are secured to each other upon tightening of screws 7.

A cover 8, which covers a top of the armature 6, is installed to a top opening of the yoke 4. An opening 9, which can communicate between an interior and an exterior of the motor main body 3, is provided between the top opening of the yoke 4 and the cover 8.

The armature 6 includes a rotatable shaft 10, a core 11, coils 12 and a commutator 13. The core 11 is secured to the rotatable shaft 10, and the coils 12 are wound around the core 11. Furthermore, the commutator 13 is secured to the rotatable shaft 10 on a top side of the core 11. A lower end of the rotatable shaft 10 is rotatably supported by a bearing 14, which is provided in a bottom center of the yoke 4. Furthermore, a top end side of the rotatable shaft 10 is rotatably supported by a bearing 15, which is provided in the cover 8. Also, a top end of the top end side of the rotatable shaft 10 protrudes upwardly and outwardly from the cover 8. A fan 16 is integrally rotatably secured to the top end of the rotatable shaft 10, which protrudes from the cover 8. Furthermore, a brush holder (not shown) is provided inward of the cover 8. Brushes (not shown), which are received in the brush holder, slidably engage the commutator 13.

A communication hole 4a is provided in the base of the yoke 4 to communicate between the interior and the exterior of the motor main body 3. The communication hole 4a is communicated with a communication passage 17, which is formed by the base of the receiving portion 2a of the motor holder 2 and the base of the yoke 4.

A lower case 20 is secured to a lower surface 2c of the flange 2b of the motor holder 2 by, for example, screws. The lower case 20 forms an air passage 18 and receives a drive circuit device 19, which controls operation of the motor main body 3. The air passage 18 is communicated with the communication hole 4a through the communication passage 17 and is also communicated with an intake hole 2d, which is formed in an outer peripheral part of the flange 2b. A partition wall 21, which separates between the air passage 18 and the drive circuit device 19, is arranged in the interior of the lower case 20. The interior of the lower case 20 is partitioned by the partition wall 21, so that a circuit receiving portion 22 is formed. The drive circuit device 19 is received in the circuit board receiving portion 22.

A blower case 23 is installed to a top surface 2e of the flange 2b to surround the fan 16. An air intake opening 24, which is communicated with an intake duct (not shown) that guides passenger compartment interior air or exterior air, is formed in a top part of the blower case 23. An air opening (not shown), which is communicated with an air duct (not shown), is formed in a peripheral wall of the blower case 23. When the fan 16 is rotated, the air, which is drawn through the air intake opening 24, is supplied to the passenger compartment through the air duct and the air conditioning system (not shown).

A branching duct 25 is formed in the blower case 23 to branch out a portion of the air drawn through the air intake opening 24. The branching duct 25 is communicated with the intake hole 2d. A portion of the air, which is drawn through the air intake opening 24 upon rotation of the fan 16, is supplied to the interior of the motor main body 3 through the branching duct 25, the air passage 18, the communication passage 17 and the communication hole 4a and serves as cooling air for cooling the interior of the motor main body 3.

Figure 2:
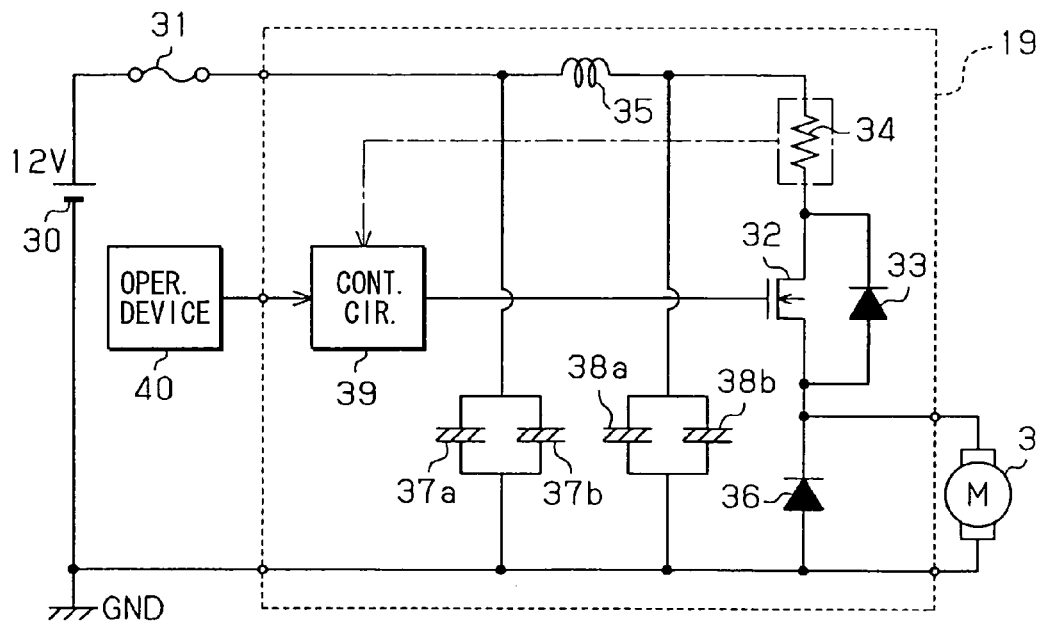
FIG. 2 is a circuit diagram of a drive circuit device of the motor.

Next, the drive circuit device 19 will be described. As shown in FIG. 2, drive electric power is supplied from a vehicle battery 30 to the drive circuit device 19 through a fuse 31. The drive circuit device 19 includes an N-channel MOS transistor (hereinafter, simply referred to as a transistor) 32, two diodes 33, 36, an electric current sensing resistor 34, a choke coil 35, four capacitors 37a, 37b, 38a, 38b and a control circuit 39. The transistor 32 is a switching element for switching the drive circuit device 19.

One of two power supply terminals of the motor main body 3 is connected to a plus terminal of the battery 30 through the transistor 32, the electric current sensing resistor 34, the choke coil 35 and the fuse 31. The other one of the two power supply terminals of the motor main body 3 is grounded, i.e., is connected to a ground (GND).

One end of the choke coil 35 is grounded through the capacitors 37a, 37b, which are connected in parallel. Furthermore, the other end of the choke coil 35 is grounded through the capacitors 38a, 38b, which are connected in parallel. The capacitors 37a, 37b, 38a, 38b and the choke coil 35 are arranged to reduce power supply noise.

The electric current sensing resistor 34 senses drive electric current, which passes through the drive circuit device 19. The control circuit 39 forcefully stops operation of the motor main body 3 when it is determined that excessively large drive electric current, which is larger than a predetermined value, is supplied to the drive circuit device 19 based on the value of the drive electric current, which is measured by the electric current sensing resistor 34.

The diode 33, which protects the transistor 32, is connected between a source and a drain of the transistor 32. The diode 36 is connected between the terminals of the motor main body 3 to return counter electromotive force, which is generated by the motor main body 3, to the motor main body 3 to improve the efficiency of the motor main body 3 and to reduce the noise.

ON-OFF control, i.e., PWM control of the transistor 32 is performed based on the control signal, which is outputted from the control circuit 39. The control circuit 39 changes a duty ratio of the control signal to adjust the ON time period of the transistor 32 based on a command value, which is outputted from an external operating device 40 upon operation of the external operating device 40. More specifically, the control circuit 39 adjusts the drive power supply, which supplies the drive power to the motor main body 3, to adjust the rotational speed of the motor main body 3 to a corresponding speed, which corresponds to the operation of the operating device 40.

Figure 3:
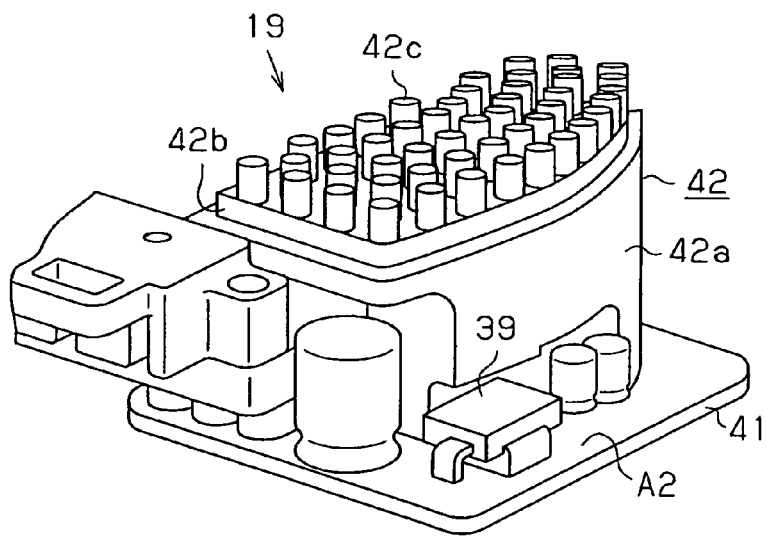
FIG. 3 is a perspective view of the drive circuit device.
Figure 4A:
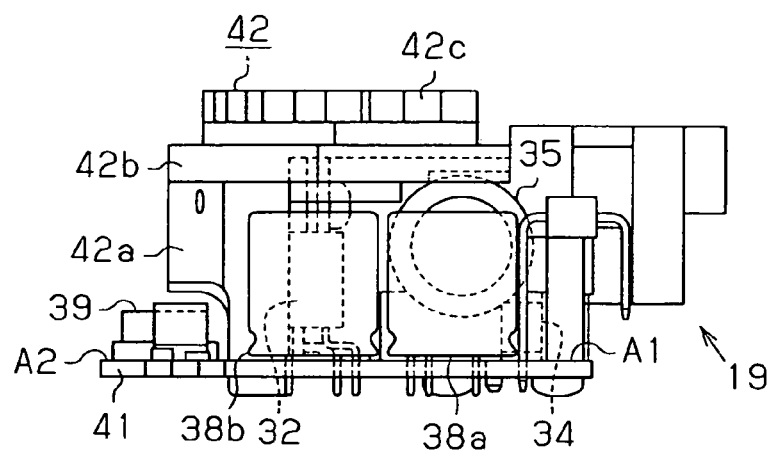
FIG. 4A is a front view of the drive circuit device.
Figure 4B:
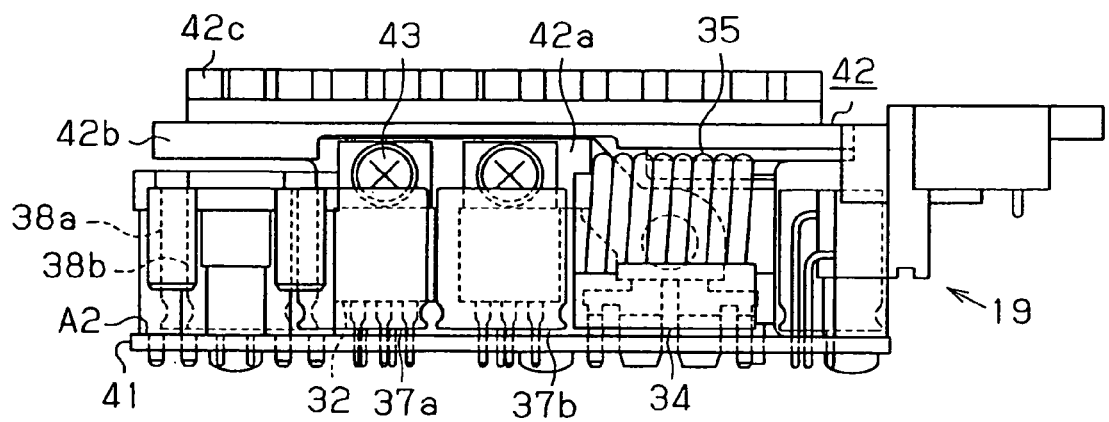
FIG. 4B is a side view of the drive circuit device.

As shown in FIGS. 3, 4A and 4B, the drive circuit device 19 has a generally rectangular shaped circuit board 41. The circuit board 41 supports the control circuit 39 and the circuit elements, such as the transistor 32, the diodes 33, 36 (shown only in FIG. 2), the electric current sensing resistor 34, the choke coil 35 and the capacitors 37a, 37b, 38a, 38b. Among the above circuit elements, the transistor 32, the electric current sensing resistor 34 and the choke coil 35 are considered as high heat-generating circuit elements, which generate the relatively large amount of heat upon operation thereof.

Furthermore, the circuit board 41 has a heat sink member 42 that is made of high heat releasable metal, such as aluminum, which shows high heat releasing capability. The heat sink member 42 includes a support column 42a and a heat sink plate 42b. The support column 42a is secured to the circuit board 41, and the heat sink plate 42b is formed on the top end of the support column 42a.

The support column 42a is formed into a plate shape and is arranged along a longitudinal direction of the circuit board 41. Furthermore, the support column 42a is secured to the circuit board 41 by, for example, screws. The support column 42a is arranged between the heat sensitive control circuit 39 and the other elements, i.e., the transistor 32, the electric current sensing resistor 34 and the choke coil 35 to divide the circuit board 41 between a first circuit part A1 and a second circuit part A2. The first circuit part A1 includes the high heat-generating circuit elements, which generate the relatively large amount of heat, and the second circuit part A2 includes the control circuit 39. The transistor 32, which particularly generates the relatively large amount of heat through the switching operation in the PWM control, is provided in the first circuit part A1 and is directly secured to the support column 42a by a screw 43 to facilitate the heat release.

The heat sink plate 42b is formed into a generally rectangular shape and extends from the top end of the support column 42a in such a manner that the heat sink plate 42b covers the high heat-generating circuit elements (the transistor 32, the electric current sensing resistor 34 and the choke coil 35), which generate the relatively large amount of heat. More specifically, the heat sink plate 42b is formed to cover the top of the first circuit part A1 and effectively absorbs heat generated from each circuit element of the first circuit part A1. A plurality of cylindrical heat sink fins 42c is provided on a top surface of the heat sink plate 42b. The heat sink fins 42c increase the surface area on the heat sink plate 42b to facilitate the heat release.

As shown in FIG. 1, the drive circuit device 19, which includes the heat sink member 42, is received in the circuit receiving portion 22 in such a manner that the first circuit part A1 is located on a motor main body 3 side (an armature 6 side or a first side) of the support column 42a of the heat sink member 42, and the second circuit part A2 is located on a counter motor main body 3 side (a counter armature 6 side or a second side) of the support column 42a of the heat sink member 42, which is opposite from the motor main body 3 (the armature 6). At this time, on the top surface 2e side, i.e., the fan 16 side of the flange 2b, the heat sink fins 42c of the heat sink member 42 are exposed from an opening of the circuit receiving portion 22, which is provided at the top side of the circuit receiving portion 22. Upon operation of the motor main body 3, when the circuit elements, such as the transistor 32, the electric current sensing resistor 34 and the choke coil 35, generate the heat, such heat is transmitted to the support column 42a and is then conducted to the heat sink plate 42b. Thereafter, the heat is released from the heat sink fins 42c of the heat sink plate 42b.

In the vehicle air conditioning system motor 1, when the motor main body 3 is rotated at the predetermined rotational speed through the control operation of the control circuit 39, which is performed based on the operation of the operating device 40, the fan 16 is rotated to blow the air. At this time, a portion of cooling air, which is generated by the fan 16, passes through the branching duct 25 and is conducted interiorly as cooling air. Then, this cooling air is supplied to the interior of the motor main body 3 through the intake hole 2d, the air passage 18, the communication passage 17 and the communication hole 4a of the yoke 4 and cools the interior (e.g., the coils 12, the brushes, the commutator 13 and the like) of the motor main body 3. Thereafter, the cooling air is discharged from the opening 9, which is formed between the yoke 4 and the cover 8. A portion of the cooling air, which is discharged from the opening 9, passes above the heat sink plate 42b (the heat sink fins 42c) of the heat sink member 42 and cools the heat sink member 42.

The above embodiment provides the following advantages.

(1) The circuit board 41 is divided by the support column 42a of the heat sink member 42 into the first circuit part A1, which includes the high heat-generating circuit elements (the transistor 32, the electric current sensing resistor 34 and the choke coil 35) and the second circuit part A2, which includes the control circuit 39. Thus, the heat, which is generated from the respective heat generating circuit elements contained in the first circuit part A1, is conducted to the heat sink plate 42b through the support column 42a and is released from the heat sink fins 42c of the heat sink plate 42b. Therefore, the heat, which is generated from the respective circuit elements, is less likely transmitted to the second circuit part A2, which includes the control circuit 39. As a result, transmission of the heat, which is generated from the respective circuit elements, to the control circuit 39 can be limited.

The heat sink member 42 (the support column 42a) is originally provided in the drive circuit device 19 to release the heat generated from the respective circuit elements (the transistor 32, the electric current sensing resistor 34 and the choke coil 35). When the circuit board 41 is divided into the first circuit part A1 and the second circuit part A2 through use of the support column 42a of the heat sink member 42, the transmission of the heat to the control circuit 39 can be advantageously limited by releasing the heat generated from the respective circuit elements of the first circuit part A1 while limiting an increase in a size of the drive circuit device 19 and of the motor.

(2) In the vehicle air conditioning system motor 1, the first circuit part A1, which includes the heat-generating circuit elements, is arranged on the armature 6 side of the support column 42a of the heat sink member 42, and the second circuit part A2, which includes the control circuit 39, is arranged on the counter armature 6 side of the support column 42a of the heat sink member 42. At the time of driving the motor main body 3, the armature 6 generates heat. However, the first circuit part A1 is arranged downstream of the second circuit part A2 and the support column 42a. With this structure, the heat, which is generated from the respective heat generating circuit elements, and the heat, which is generated from the armature 6, are both limited from reaching the control circuit 39 by the support column 42a of the heat sink member 42.

(3) On the circuit board 41, the heat sink member 42 is provided to cover the high heat-generating circuit elements (the transistor 32, the electric current sensing resistor 34 and the choke coil 35). Thus, the radiation noise, which is generated by the drive electric current that passes the respective circuit elements, is less likely conducted externally from the first circuit part A1.

(4) The support column 42a, which divides the circuit board 41 into the first circuit part A1 and the second circuit part A2, is secured to the circuit board 41 and is not provided to the motor holder 2 and the lower case 20. Thus, the drive circuit device 19 can be easily installed to the motor holder 2.

The embodiment of the present invention can be modified as follows.

In the above embodiment, the circuit board 41 is divided by the support column 42a in such a manner that the heat-generating circuit elements (the transistor 32, the electric current sensing resistor 34 and the choke coil 35) are all included in the first circuit part A1. Alternatively, the circuit board 41 may be divided by the support column 42a in such a manner that at least one of the heat-generating circuit elements is included in the first circuit part A1. At this time, it is preferred that the first circuit part includes the switching element (the transistor 32), which generates the relatively large amount of heat. In this case, the heat, which is generated by the circuit element of the first circuit part A1, is limited by the support column 42a from reaching the second circuit part A2, which includes the control circuit 39.

Thus, the heat, which is generated by the circuit element of the first circuit part A1, is advantageously limited from reaching the control circuit 39.

In the vehicle air conditioning system motor 1 of the above embodiment, the drive circuit device 19 is arranged in such a manner that the first circuit part A1 is arranged on the armature 6 side of the support column 42a of the heat sink member 42, and the second circuit part A2 is arranged on the counter armature 6 side of the support column 42a of the heat sink member 42. However, the drive circuit device 19 may be provided in the vehicle air conditioning system motor 1 in such a manner that the first circuit part A1 is arranged on the counter armature 6 side of the support column 42a of the heat sink member 42, and the second circuit part A2 is arranged on the armature 6 side of the support column 42a of the heat sink member 42. Furthermore, the first circuit part A1 and the second circuit part A2 are not limited to the above ones and can be arranged in conformity with the shape of the vehicle air conditioning system motor 1.

In the above embodiment, the N-channel MOS transistor 32 is used. Alternatively, any other transistor, such as field-effect transistor (FET) or a bipolar transistor, may be used.

In the above embodiment, the drive circuit device 19 is provided in the vehicle air conditioning system motor 1. However, the present invention is not limited to this. For example, the drive circuit device 19 may be provided in a motor, such as a brushless motor, other than the vehicle air conditioning system motor 1.

Additional advantages and modifications will readily occur to those skilled in the art. The invention in its broader terms is therefore not limited to the specific details, representative apparatus, and illustrative examples shown and described.

What is claimed is:

1. A drive circuit device for a motor, the drive circuit device comprising:
    a plurality of circuit elements that are provided to operate the motor and generate heat upon operation thereof;
    a heat sink member that releases the heat, which is generated from one or more of the plurality of circuit elements;
    a control circuit that controls operation of the motor; and
    a circuit board that supports the plurality of circuit elements, the heat sink member and the control circuit, wherein:
    the heat sink member divides the circuit board into a first circuit part and a second circuit part;
    the first circuit part includes at least one of the plurality of circuit elements; and
    the second circuit part includes the control circuit.

2. The drive circuit device according to claim 1, wherein the first circuit part includes all of the plurality of circuit elements.

3. The drive circuit device according to claim 1, wherein:
    the motor includes an armature;
    the first circuit part is arranged on a first side of the heat sink member where the armature is located; and
    the second circuit part is arranged on a second side of the heat sink member, which is opposite from the armature.

4. The drive circuit device according to claim 1, wherein:
    the heat sink member is made of metal; and
    a height of the heat sink member, which is measured in a direction perpendicular to a plane of the circuit board, is greater than that of any of the plurality of circuit elements and that of the control circuit.

5. The drive circuit device according to claim 1, wherein the heat sink member has a plurality of heat sink fins at a top of the heat sink member.

6. A motor comprising a drive circuit device, which includes:
    a plurality of circuit elements that are provided to operate the motor and generate heat upon operation thereof;
    a heat sink member that releases the heat, which is generated from one or more of the plurality of circuit elements;
    a control circuit that controls operation of the motor; and
    a circuit board that supports the plurality of circuit elements, the heat sink member and the control circuit, wherein:
    the heat sink member divides the circuit board into a first circuit part and a second circuit part;
    the first circuit part includes at least one of the plurality of circuit elements; and
    the second circuit part includes the control circuit.

7. The motor according to claim 6, wherein the first circuit part includes all of the plurality of circuit elements.

8. The motor according to claim 6, further comprising an armature, wherein:
    the first circuit part is arranged on a first side of the heat sink member where the armature is located; and
    the second circuit part is arranged on a second side of the heat sink member, which is opposite from the armature.

9. The motor according to claim 6, wherein:
    the heat sink member is made of metal; and
    a height of the heat sink member, which is measured in a direction perpendicular to a plane of the circuit board, is greater than that of any of the plurality of circuit elements and that of the control circuit.

10. The motor according to claim 6, wherein the heat sink member has a plurality of heat sink fins at a top of the heat sink member.

* * * * *